United States Patent [19]

Nogami

[11] Patent Number: 4,855,957

[45] Date of Patent: Aug. 8, 1989

[54] RANDOM ACCESS MEMORY INCLUDING SWITCHING ELEMENTS TO LIMIT THE NUMBER OF ENERGIZED DATA IN PAIRS

[75] Inventor: Kazutaka Nogami, Yokohama, Japan

[73] Assignee: Kabushiki Kaisha Toshiba, Kawasaki, Japan

[21] Appl. No.: 28,549

[22] Filed: Mar. 20, 1987

[30] Foreign Application Priority Data

Mar. 31, 1986 [JP] Japan .................................. 61-72821

[51] Int. Cl.⁴ ......................... G11C 7/00; G11C 8/00
[52] U.S. Cl. ......................... 365/230.03; 365/189.04; 365/189.05; 365/230.08
[58] Field of Search .............................. 365/189, 230

[56] References Cited

U.S. PATENT DOCUMENTS

| | | | |
|---|---|---|---|
| 4,328,566 | 5/1982 | Thaler | 365/222 X |
| 4,472,792 | 9/1984 | Shimohigashi et al. | 365/189 X |
| 4,567,579 | 1/1986 | Patel et al. | 365/230 |
| 4,569,036 | 2/1986 | Fujii et al. | 365/230 X |
| 4,635,233 | 1/1987 | Matsumoto et al. | 365/230 X |
| 4,672,583 | 6/1987 | Nakaizumi | 365/222 X |
| 4,677,592 | 6/1987 | Sakurai et al. | 365/222 X |
| 4,691,298 | 9/1987 | Fukuda et al. | 365/189 X |
| 4,718,041 | 1/1988 | Baglee et al. | 365/185 X |

Primary Examiner—Stuart N. Hecker
Assistant Examiner—Alfonso Garcia
Attorney, Agent, or Firm—Finnegan, Henderson, Farabow, Garrett, & Dunner

[57] ABSTRACT

A random access memory having blocks of memory cells arranged two-dimensionally in groups associated with pairs of data lines. Each pair of data lines transfers write-data to and read-data from respective groups of memory blocks. A column decoder selects, for a plurality of groups, one memory block from among the blocks in a group to be connected to a corresponding data line in accordance with a column address signal. A section decoder connects the coresponding data lines which were connected to selected ones of the memory blocks to a data input/output circuit.

12 Claims, 9 Drawing Sheets

F I G. 3
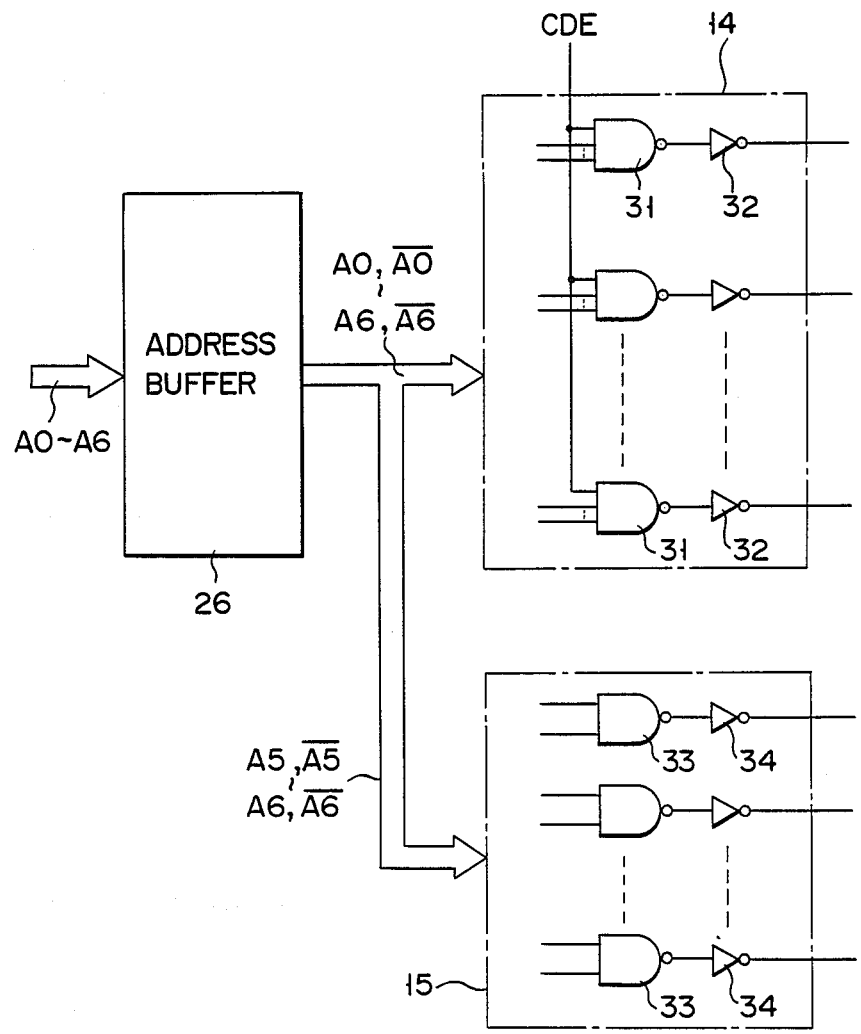

FIG. 4A

| | D1, $\overline{D1}$ | D2, $\overline{D2}$ | D3, $\overline{D3}$ | D4, $\overline{D4}$ |
|---|---|---|---|---|
| | $\overline{A5}$  $\overline{A6}$ | A5  $\overline{A6}$ | $\overline{A5}$  A6 | A5  A6 |
| $\overline{A0}$  $\overline{A1}$ | $\overline{A2}$  $\overline{A3}$  $\overline{A4}$<br>A2  $\overline{A3}$  $\overline{A4}$<br>$\overline{A2}$  A3  $\overline{A4}$<br>A2  A3  $\overline{A4}$<br>$\overline{A2}$  $\overline{A3}$  A4<br>A2  $\overline{A3}$  A4<br>$\overline{A2}$  A3  A4<br>A2  A3  A4 | DITTO | DITTO | DITTO |
| A0  $\overline{A1}$ | DITTO | DITTO | DITTO | DITTO |
| $\overline{A0}$  A1 | DITTO | DITTO | DITTO | DITTO |
| A0  A1 | DITTO | DITTO | DITTO | DITTO |

FIG. 4B

| D1, $\overline{D1}$ | D2, $\overline{D2}$ | D3, $\overline{D3}$ | D4, $\overline{D4}$ |
|---|---|---|---|
| $\overline{A5}$  $\overline{A6}$ | A5  $\overline{A6}$ | $\overline{A5}$  A6 | A5  A6 |

F I G. 9
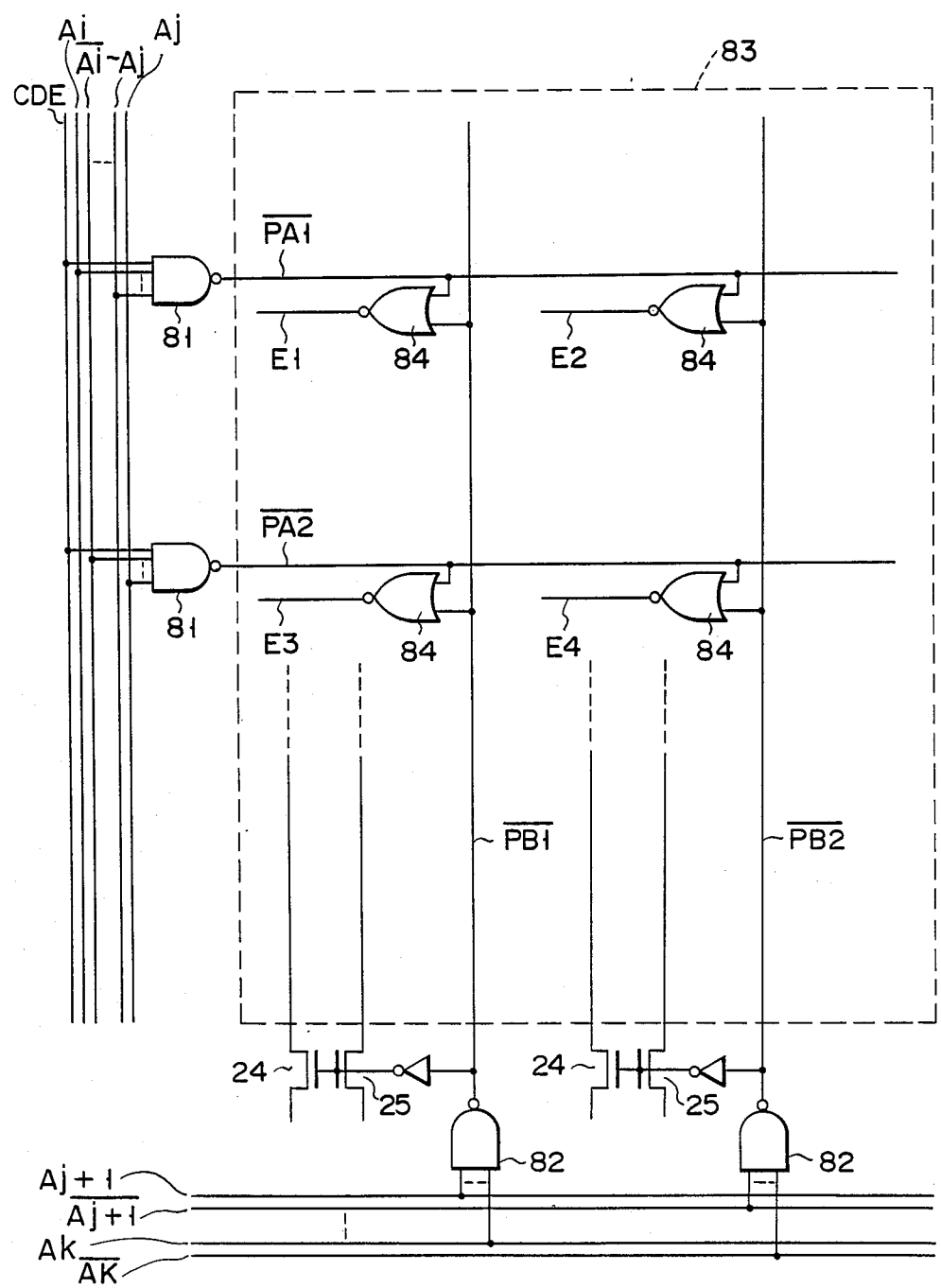

RANDOM ACCESS MEMORY INCLUDING SWITCHING ELEMENTS TO LIMIT THE NUMBER OF ENERGIZED DATA IN PAIRS

BACKGROUND OF THE INVENTION

The present invention relates to a random access memory which performs a data write/read operation and, more particularly, to realization of a high-speed operation with low current consumption of a large-capacity random access memory.

In order to realize a high-speed operation with low current consumption, some large-capacity random access memories (RAMs) have a memory cell array which is divided into a plurality of memory blocks. In such a RAM, a selected memory block among a plurality of memory blocks is activated during access. Some RAMs of this type have a memory array which is divided into a plurality of memory blocks along only a bit line direction. However, when such a RAM has a multi-bit arrangement wherein access is performed in units of a plurality of bits, wires must be provided between memory blocks to correspond in number to that of the data input/output bits. As a result, the area of the wiring portion is widened, and the chip size is increased. Therefore, a RAM having a memory cell array which is divided into memory blocks only along a bit line direction is not suitable for a RAM with a multi-bit arrangement.

Some RAMs have a memory cell array which is two-dimensionally divided into a plurality of memory blocks.

In a RAM of this type, for example, a first data line is provided for every n memory blocks, and a second data line is provided for every 2 sets of the n memory blocks. During a data read operation, one memory cell is selected in each of the n memory blocks, and one cell data of each selected memory cell is selectively read out to each first data line. Either of the data read out by 2 first data lines is transferred to the second data line. Then, the second data lines are selected for the number of required bits, and data of the selected second data lines are supplied to a data I/O circuit. Note that during a data write operation, the basic concept is the same as described above except that data flows in the reverse order.

In a RAM having the above arrangement, wires need not be provided between memory blocks to correspond in number to that of the input/output data bits. For this reason, when the number of input/output bits is increased by the multi-bit arrangement, and the chip size need not be increased.

However, all the second data lines are activated at once during access. That is, cell data are read out to all the second data lines during the data read operation. During the data write operation, cell data are read out once to all the second data lines, and write data is supplied only to the selected second data line.

In order to realize high-speed data transfer during memory access, capacitance which is driven during data transfer must be minimized. In order to minimize the capacitance, the number of memory blocks is increased to increase the number of the second data lines. However, each second line is provided between the memory block and the data I/O circuit and hence has a large wiring length, thereby having a relatively large capacitance. For this reason, as the number of second data lines is increased, current consumption is increased.

In addition, the number of second data lines must be decreased to decrease the current consumption. In this case, the number of memory blocks is decreased, and the number of sense amplifiers connected to the second data lines is increased along therewith. Therefore, a load capacitance of each second data line is increased, resulting in a low data transfer speed.

As described above, a conventional RAM having a memory cell array which is divided into a plurality of memory blocks cannot satisfy the problems of current consumption and a data transfer speed at the same time.

SUMMARY OF THE INVENTION

The present invention has been made in consideration of the above situation, and has as its object to provide a random access memory, having a memory cell array which is divided into a plurality of memory blocks, and capable of realizing low current consumption and a high speed operation at the same time.

According to the present invention, there is provided a random access memory comprising: a plurality of two-dimensionally arranged memory blocks each consisting of a plurality of memory cells; a plurality of data lines for transferring write data to or read data from the memory cells; a first switching means for selectively connecting a specific memory block to the each data line in accordance with an address signal; a data input/output means for receiving write data for the memory cells and for outputting read data from the memory cells from and to an external device; and a second switching means, provided between the data lines and the data input/output means, for selectively connecting the data line connected to the memory block by the first switching means.

In addition, according to the present invention, there is provided a random access memory comprising: a plurality of two-dimensionally arranged memory blocks each consisting of a plurality of memory cells; a plurality of first data lines for transferring input/output data of memory cells in each memory block; a plurality of second data lines arranged between the memory blocks; a first switching means, provided between the first and second data lines, for selectively connecting a specific first data line to the second data line in accordance with an address signal; a data input/output means for receiving write data for the memory cells and for outputting read data from the memory cells from and to an external device; and a second switching means, provided between the second data lines and the data input/output means, for selectively connecting the second data line connected to the first data line by the first switching means to the data input/output means.

Furthermore, according to the present invention, there is provided a random access memory comprising: a plurality of memory blocks each having a plurality of memory cells; a memory block selecting means for selecting one memory block from every n memory blocks in accordance with an address signal; a data latch means for latching write data for each memory block selected by the memory block selecting means and read data from the memory cells; a plurality of data lines for transferring read data from the each memory block and write data for each memory block; a first switching means for selectively connecting any of (n/2) data latch means to the data lines in accordance with a control signal; a data input/output means for receiving write data for the plurality of memory blocks and for outputting read data from the memory blocks from and to an external device; and a second switching means, provided between the data lines and the data input/output means, for selectively connecting the data line connected to the data latch means by the first switching means to the data input/output means.

BRIEF DESCRIPTION OF THE DRAWINGS

FIG. 3 is a circuit diagram of an address decoder circuit of the memory according to the first embodiment of the present invention;

FIGS. 4A and 4B are views of an address decode state of the decoder circuit of FIG. 3;

FIG. 9 is a block diagram of an arrangement of a modification of the present invention.

DETAILED DESCRIPTION OF THE PREFERRED EMBODIMENTS

Preferred embodiments of the present invention will now be described in detail with reference to the accompanying drawings.

Figure 1:
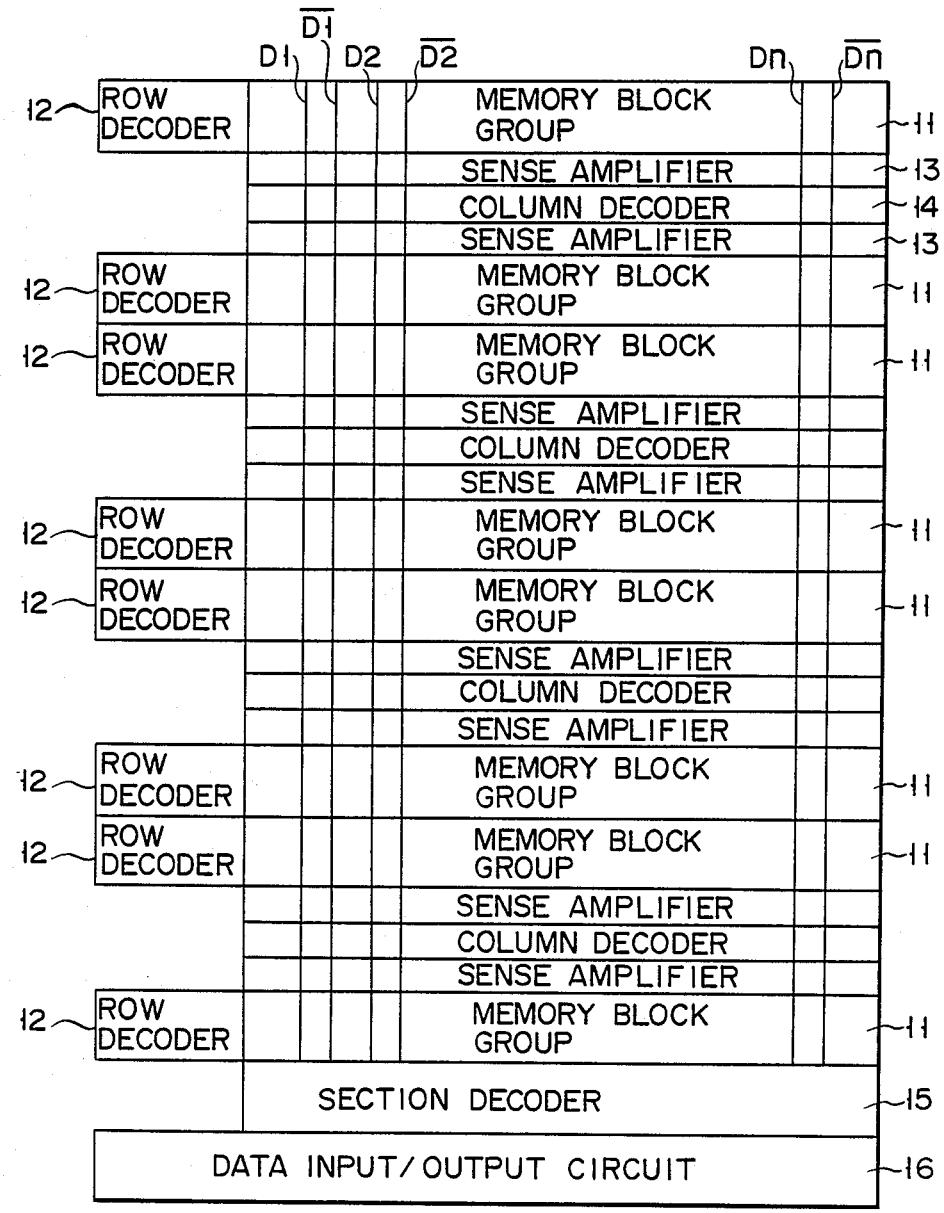
FIG. 1 is a block diagram of an arrangement of a memory according to a first embodiment of the present invention.

FIG. 1 is a block diagram showing an arrangement of a memory according to a first embodiment of the present invention. The memory according to the first embodiment is an 8-bit parallel read/write RAM.

A memory cell array is constituted by memory block groups 11 each consisting of a plurality of memory blocks. In this embodiment, 8 memory block groups 11 are provided, and a plurality of memory cells are provided in each memory block. D1, $\overline{D1}$ to Dn, and $\overline{Dn}$ are pairs of data lines, respectively, and these n pairs of data lines extend along the arranged direction of 8 groups 11. Row decoder 12, sense amplifier 13, and column decoder 14 are provided for each group 11, and section decoder 15 and data input/output circuit 16 are provided for n pairs of data lines D1, $\overline{D1}$ to Dn, and $\overline{Dn}$.

Figure 2:
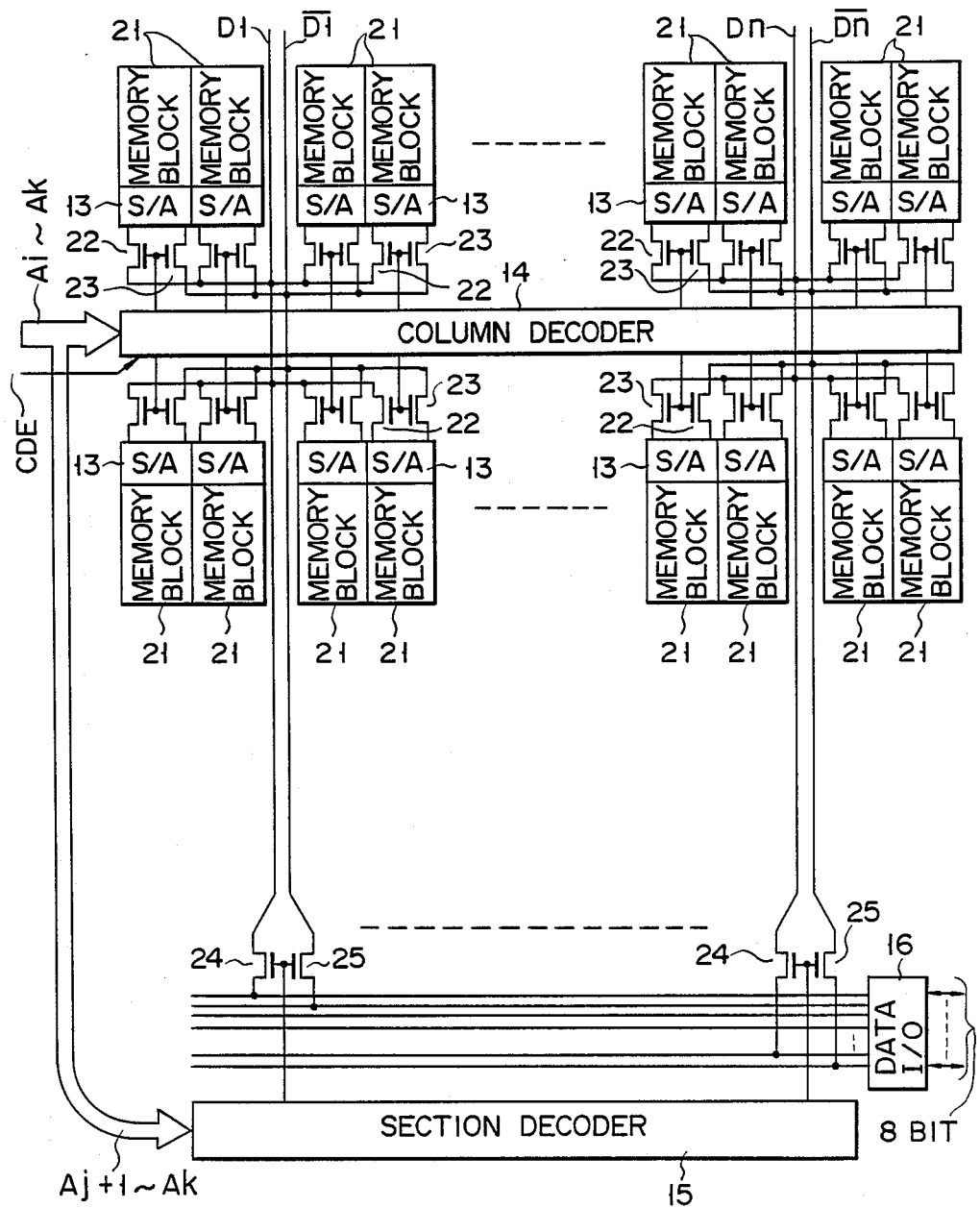
FIG. 2 is a circuit diagram of a part of the memory according to the first embodiment of the present invention.

FIG. 2 is a block diagram showing the memory of FIG. 1 in more detail.

In FIG. 2, reference numeral 21 denotes a memory block which is provided in each group 11. In this embodiment, (4×4×8), i.e., 128 blocks 21 are provided in each group 11. Therefore, blocks 21 of the memory according to the first embodiment are two-dimensionally arranged by 128 in a lateral direction and 8 in a longitudinal direction. Read data from blocks 21 are respectively amplified by sense amplifiers (S/A) 13. One pair of MOS transistors 22 and 23, which are switched in accordance with a decode output from decoder 14, are connected between each amplifier 13 and each pair of data lines Di and $\overline{Di}$ (i=1 to n, where n=32).

Timing signal CDE and address signals, Ai to Ak are input to decoder 14. Decoder 14 selects only one pair of transistors 22 and 23 in units of 8 memory blocks in accordance with signals CDE and Ai to Ak. Similar conduction control is also performed for each of 8 sets of 8 blocks 21. In this case, the number 8 corresponds to that of data bits which are input/output in parallel through circuit (data I/O) 16. Therefore, read data from 8 blocks 21 are transferred only to 8 pairs of data lines selected by decoder 14 from 32 pairs of lines Di and $\overline{Di}$. One pair of transistors 24 and 25, which are switched in accordance with a decode output from decoder 15, are connected between each of n pairs of lines Di and $\overline{Di}$ and circuit 16. The same signals Aj+1 to Ak (where i<j<k, or i>j>k) as input to decoder 14 are input to decoder 15. In accordance with the decode output from decoder 15, only 8 out of 32 pairs of transistors 24 and 25, connected to 8 pairs of lines Di and $\overline{Di}$, to which data are already read out, are conducting. Therefore, 8-bit data is output from circuit 16.

Similarly, during the data writ operation, only 8 pairs of transistors 24 and 25 are conducting in accordance with the decode output from decoder 15. Then, 8-bit data, input from circuit 16, is supplied to 8 pairs of lines Di and $\overline{Di}$, to which data are already read out, thereby performing the data write operation.

In such a RAM, parts of address input signals of decoders 14 and 15 are used in common, so that lines Di and $\overline{Di}$ are activated by the number of bits required for one read or write operation, i.e., 8 bits. For this reason, when the number of lines Di and $\overline{Di}$ is increased to minimize the capacitance which is driven during data transfer so as to realize high speed data transfer, current consumption is not increased. Therefore, the number of sense amplifiers connected to lines Di and $\overline{Di}$ can be optimized, resulting in high speed data transfer.

FIG. 3 is a circuit diagram showing an arrangement of decoders 14 and 15 of the memory according to the first embodiment. In FIG. 3, address signals Ai to Ak are of 7 bits, i.e., A0 to A6, and are supplied to address buffer 26. Buffer 26 forms in-phase signals A and opposite-phase signals $\overline{A}$ with respect to the address signals. Signals A0,$\overline{A0}$ to A6,$\overline{A6}$ are supplied to decoder 14, and signals A5,$\overline{A5}$ and A6,$\overline{A6}$ are supplied to decoder 15.

As shown in FIG. 3, decoder 14 includes NAND gates 31 and inverters 32 for inverting outputs from gates 31. Each NAND gate 31 receives timing signal CDE and a given combination of complementary 7-bit signals A0, $\overline{A0}$ to A6, $\overline{A6}$ formed by buffer 26.

Section decoder 15 includes NAND gates 33 and inverters 34 for inverting outputs from gates 33. Each NAND gate 33 receives a given combination of complementary 2-bit signals A5, $\overline{A5}$ and A6, $\overline{A6}$.

In decoder 14 having the above arrangement, when signal CDE is at level "1", an output from each gate 31, where address signals input thereto are all at level "1", goes to level "0", and an output from corresponding inverter 32 goes to level "1", thereby conducting a pair of transistors 22 and 23. In this manner, a total of 8 pairs of transistors 22 and 23 are conducting.

FIG. 4A shows address signals supplied to gates 31 in decoder 14, and FIG. 4B shows address signals supplied to NAND gates 33 in decoder 15. Memory blocks 21 in 8 memory block groups 11 are arranged in a state of 32 lateral sets ×4 vertical sets where one set consists of 8 memory blocks including 2 vertically adjacent blocks and 4 laterally adjacent blocks. The number 32 of lateral sets corresponds to the number of data lines described above, in which only 4 sets of lines D1, $\overline{D1}$ to D4, and $\overline{D4}$ are shown in FIGS. 4A and 4B. The same address signals as for lines D1, $\overline{D1}$ to D4, and $\overline{D4}$ are input to 4 sets of other lines D5, $\overline{D5}$ to D8, and $\overline{D8}$, D9, $\overline{D9}$ to D12, and $\overline{D12}$, D13, $\overline{D13}$ to D16, and $\overline{D16}$, D17, $\overline{D17}$ to D20, and $\overline{D20}$, D21, $\overline{D21}$ to D24, and $\overline{D24}$, D25, $\overline{D25}$ to D28, and $\overline{D28}$, and D29, $\overline{D29}$ to D32, and $\overline{D32}$.

First, address signals of A0 and $\overline{A1}$ are commonly input to gates 31, in decoders 14, for selecting blocks 21 in groups 11 of the first set from the top. Address signals of A0 and A1 are commonly input to gates 31, in decoders 14, for selecting blocks 21 in groups 11 of the second set from the top. Address signals of $\overline{A0}$ and A1 are commonly input to gates 31, in decoders 14, for selecting blocks 21 in groups 11 of the third set from the top. Address signals of A0 and A1 are commonly input to gates 31, in decoders 14, for selecting blocks 21 in groups 11 of the fourth, i.e., the lowermost set from the top.

Address signals of $\overline{A5}$ and $\overline{A6}$ are commonly input to gates 31, in decoders 14, for selecting blocks 21 in groups 11 of the first set from the left in the leftright direction. Address signals of A5 and $\overline{A6}$ are commonly input to gates 31, in decoders 14, for selecting blocks 21 in groups 11 of the second set from the left. Address signals of $\overline{A5}$ and A6 are commonly input to gates 31, in decoders 14, for selecting blocks 21 in groups 11 of the third set from the left. Address signals of A5 and A6 are commonly input to gates 31, in decoders 14, for selecting blocks 21 in groups 11 of the fourth set from the left.

In addition, 8 different kinds of combination signals of address signals of A2 to A4 and $\overline{A2}$ to $\overline{A4}$ are input to gates 31 in decoders 14 for selecting blocks 21 in 8 groups 11 in the respective sets.

On the other hand, address signals of $\overline{A5}$ and $\overline{A6}$ are input to gates 33 in decoder 15 for controlling MOS transistors 24 and 25 connected to data lines D1 and $\overline{D1}$. Signals of A5 and $\overline{A6}$ are input to gates 33 in decoder 15 for controlling transistors 24 and 25 connected to lines D2 and $\overline{D2}$. Address signals of $\overline{A5}$ and A6 are input to gates 33 in decoder 15 for controlling transistors 24 and 25 connected to lines D3 and $\overline{D3}$. Address signals of A5 and A6 are input to gates 33 in decoder 15 for controlling transistors 24 and 25 connected to lines D4 and $\overline{D4}$.

According to the above arrangement, one of 4 pairs of lines D1, $\overline{D1}$ to D4, $\overline{D4}$ is activated, and only the activated lines are selectively connected to data input/output circuit 16.

Figure 5:
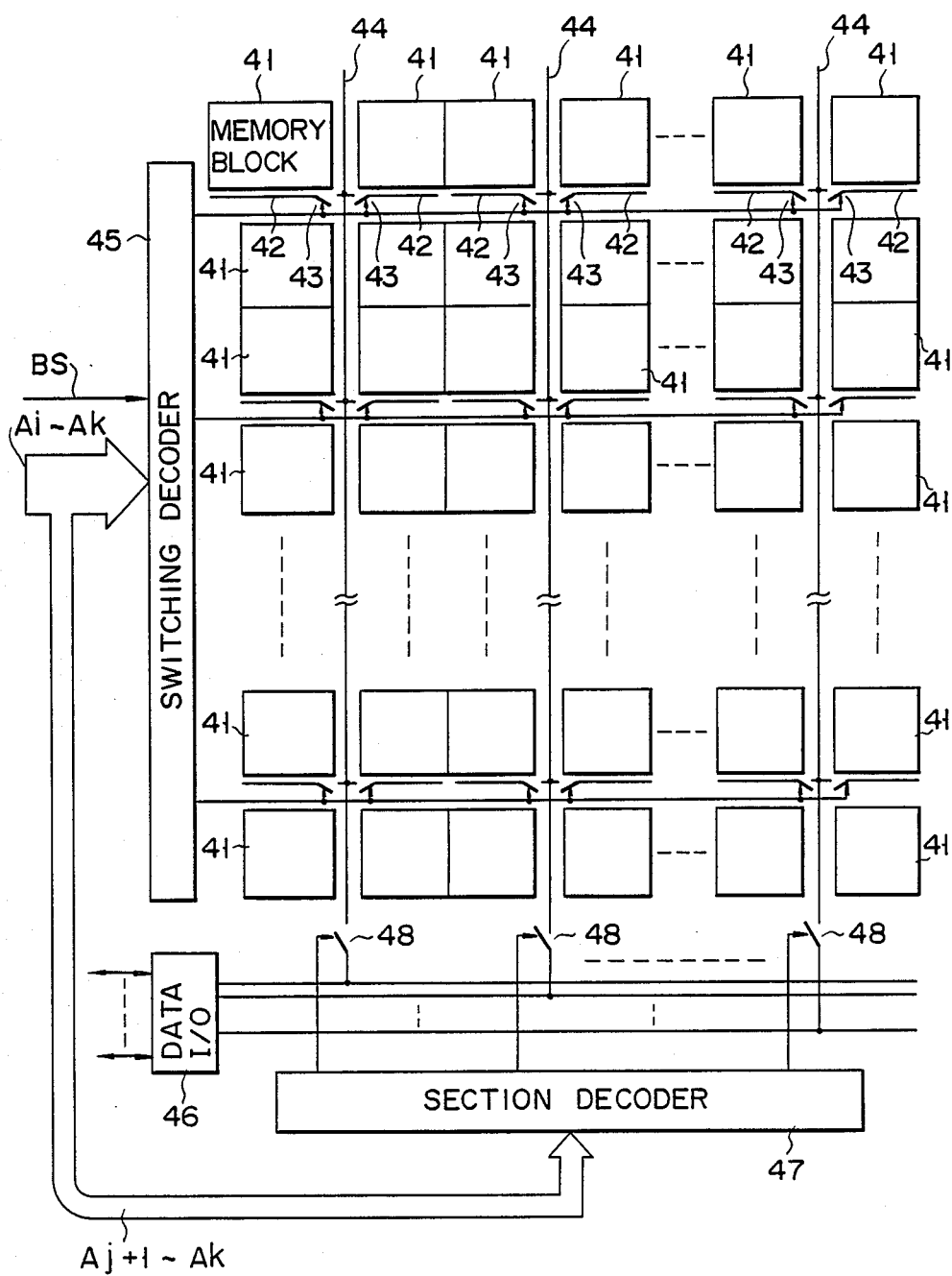
FIG. 5 is a block diagram of an arrangement of a memory according to a second embodiment of the present invention.

FIG. 5 is a block diagram showing an arrangement of a memory according to a second embodiment of the present invention. A memory cell array of the memory according to this embodiment comprises a plurality of two-dimensionally arranged memory blocks 41. Similar to the memory of the first embodiment described above, a column decoder and a sense amplifier are connected to each block 41 of the memory of the second embodiment, although not shown. Either of read data from 2, e.g., vertically adjacent blocks 41 in FIG. 5 is selected by a column decoder (not shown) and read out to first data line 42. In addition, either of data of 2 laterally adjacent lines 42 in FIG. 5 is selected by switching circuit 43 and read out to line 44. Eight first switching circuits 43 simultaneously conduct in accordance with a data output from switching decoder 45 to which address signals Ai to Aj of a plurality of bits and timing signal BS are input. The above number 8 corresponds to the number of bits of data which are input/output in parallel by data input/output circuit (data I/O) 46. Therefore, in a RAM having the above arrangement, any one bit of memory data in 4 blocks 41 is read out to lines 44 of 8 bits out of n bits. Switching circuit 48, which is switched in accordance with a decode output from section decoder 47, is connected between n-bit line 44 and circuit 46. The same address signals Aj+1 to Ak (where i<j<k, or i>j>k) as input to decoder 45 are input to decoder 47. In accordance with the decode output from decoder 47, circuit 48 connects to 8 bits out of n-bit lines 44, from which data are already read out in accordance with control of decoder 45, are conducted. Therefore, 8-bit data is output from circuit 46.

In such a RAM, parts of the address signals of decoders 45 and 47 are used in common, so that lines 44 are activated only in a number corresponding to the number of bits required during one data read/write operation, i.e., bits of data which are input/output in parallel by circuit 46. For this reason, when the number of lines 44 is increased to minimize the capacitance which is driven during data transfer so as to realize high-speed data transfer, the current consumption is not increased. Therefore, the number of sense amplifiers connected to lines 44 can be optimized to minimize the value of load capacitance, thereby increasing data transfer speed.

Figure 6:
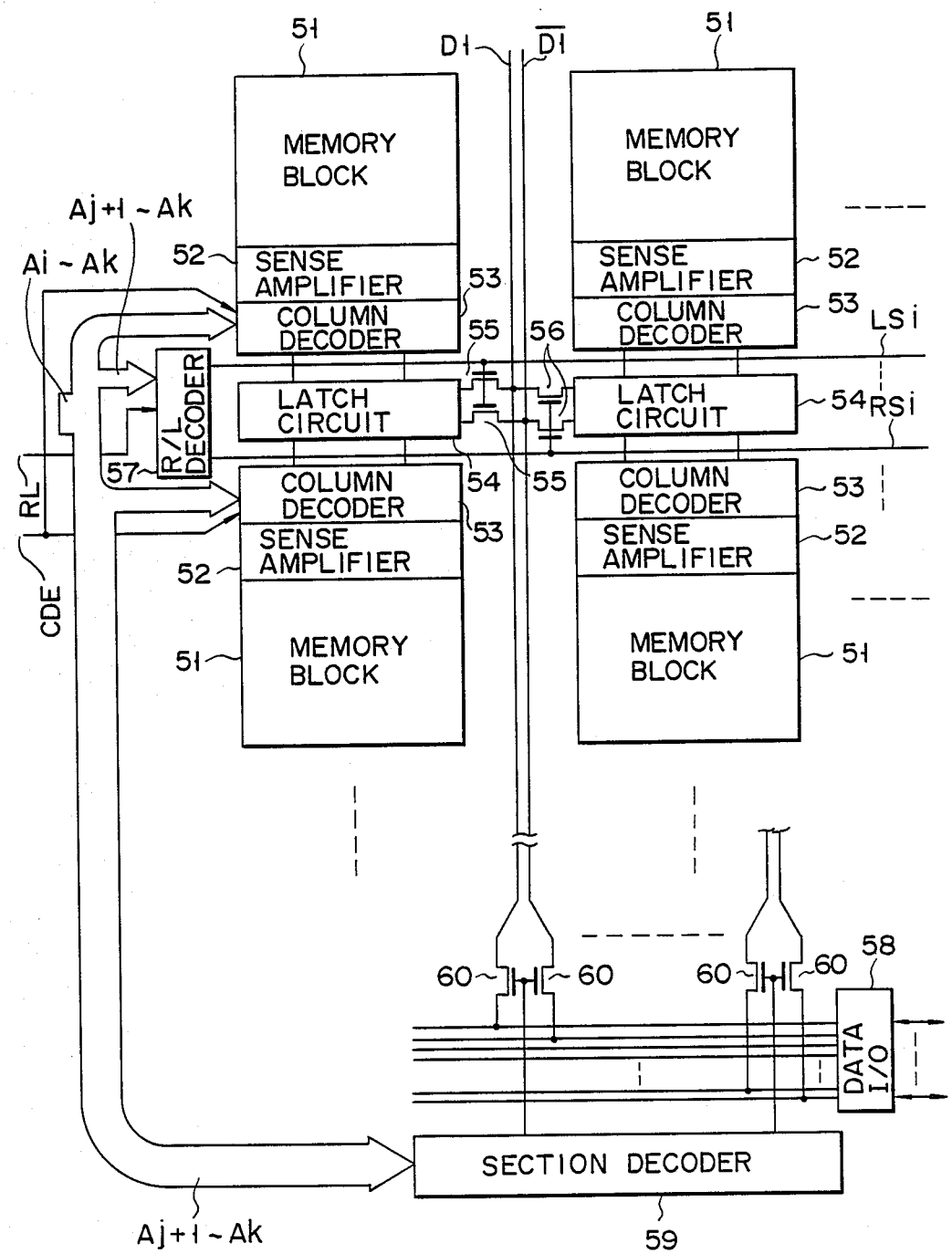
FIG. 6 is a block diagram of an arrangement of a memory according to a third embodiment of the present invention.

FIG. 6 is a block diagram showing an arrangement of a memory according to a third embodiment of the present invention. In the memory of this embodiment, the present invention is applied to an 8-bit parallel read/write RAM.

In FIG. 6, a memory cell array comprises a plurality of two-dimensionally arranged memory blocks 51. Row decoders (not shown) are connected to memory blocks 51 at every array of memory blocks arranged laterally in FIG. 6. Memory data of a memory cell in each block 51 is amplified by sense amplifier 52 consisting of a plurality of sense amplifiers. Output data of amplifier 52 connected to block 51 is supplied to column decoder 53. Timing signal CDE and a plurality of address signals Ai to Ak are input to decoder 53. Either of read data from 2 vertically adjacent blocks 51 in FIG. 6 is selected by decoder 53 and input to latch circuit 54 to be latched therein. In addition, either of read data from 2 laterally adjacent circuits 54 in FIG. 6 is selected by MOS transistor 55 or 56, and then read out to one out of n pairs of data lines Di and $\overline{Di}$ (i=1 to n). Switching signals LSi and RSi are output from RL decoder 57 and input respectively to transistors 55 and 56 so that either of which goes to level "1" in accordance with control signal RL and a plurality of address signals Ai+1 to Ak. Thus, an operation of transferring data to a pair of lines Di and $\overline{Di}$ is performed to 8 units each having 4 blocks 51 adjacent vertically and laterally. Read data from 8 units of memory blocks are output to corresponding 8 out of n pairs of lines Di and $\overline{Di}$.

Pairs of MOS transistors 60, which are switched in accordance with a decode output from section decoder 59, are connected between n pairs of lines Di and $\overline{Di}$ and data input/output circuit (data I/O) 58. The same address signals Aj+1 to Ak (where i<j<k, or i>j>k) as input to decoder 53 are input to decoder 59. In accordance with a decode output from decoder 59, only transistors 60 connected to 8 out of n pairs of lines Di and $\overline{Di}$, to which data are already read out in accordance with control of decoders 53 and 57, is conducted. Therefore, 8-bit data is output from circuit 58.

In a RAM having the above arrangement, parts of address input signals of decoders 53, 59 and RL decoder 57 are used in common, and lines Di and $\overline{\text{Di}}$ are activated only in a number corresponding to the number of bits required during one data read/write operation, i.e., bits of data which are input/output in parallel by circuit 58. For this reason, when the number of pairs of data lines is increased to minimize the capacitance which is driven during data transfer so as to realize a high-speed data transfer, the current consumption is not increased. Therefore, the number of sense amplifiers connected to data lines is optimized to minimize a value of a load capacitance, resulting in high-speed data transfer.

Figure 7:
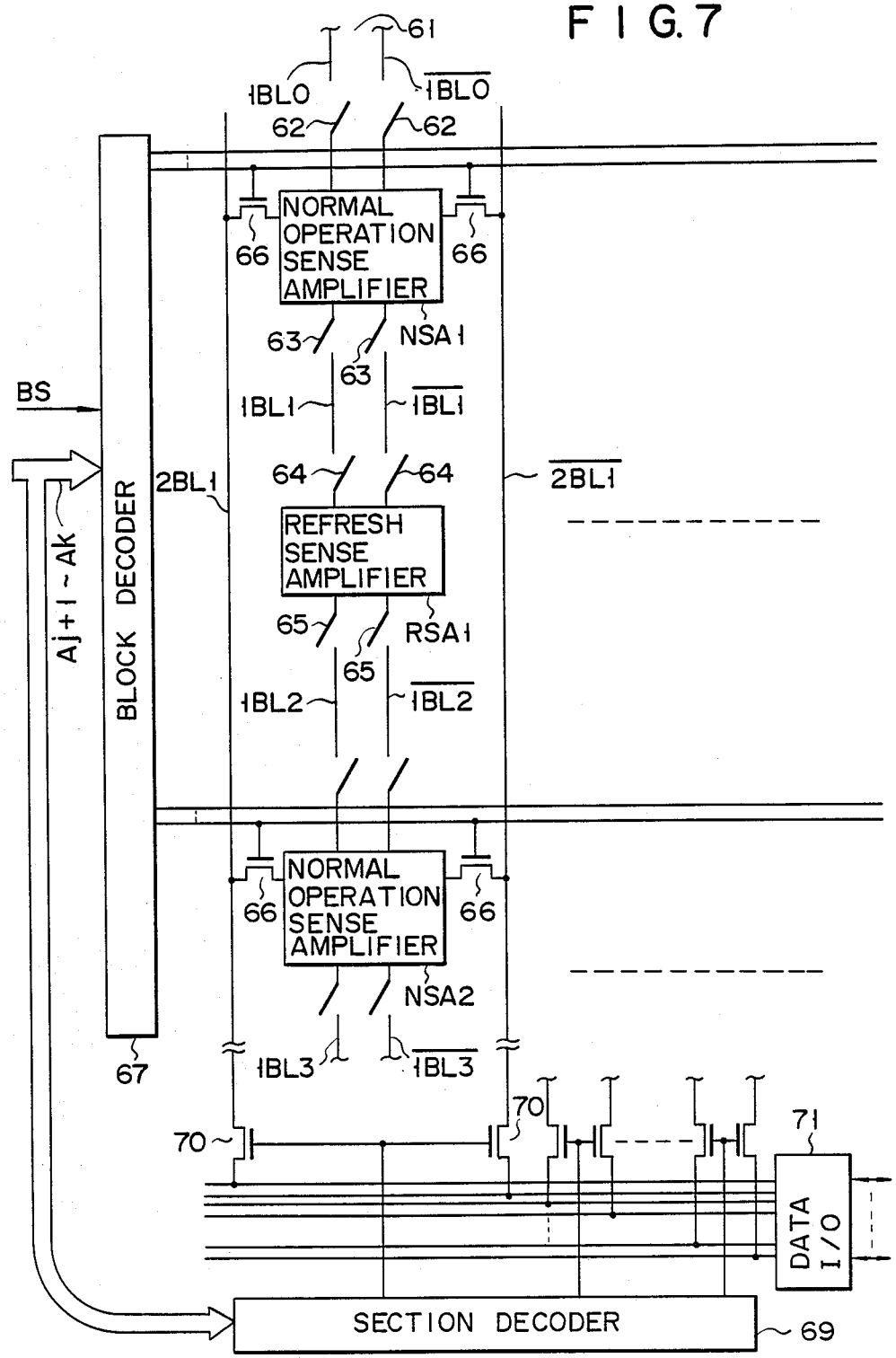
FIG. 7 is a block diagram of an arrangement of a memory according to a fourth embodiment of the present invention.
Figure 8:
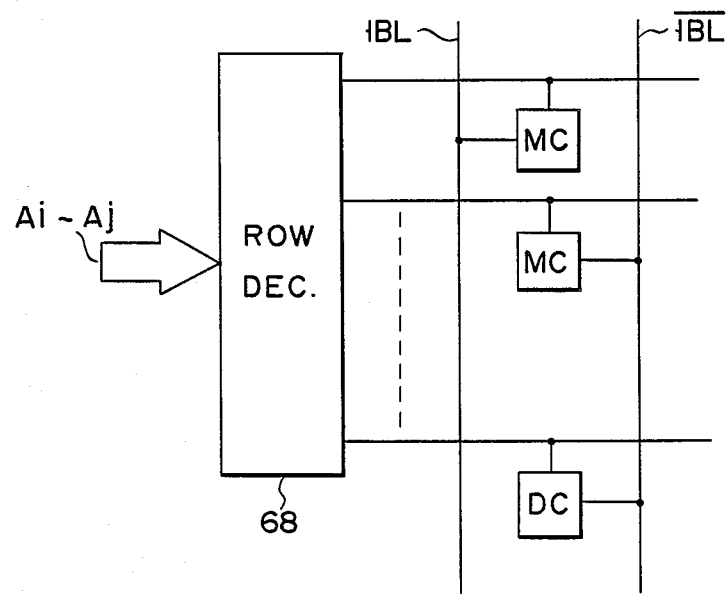
FIG. 8 is a block diagram of an arrangement of a part of the memory according to the fourth embodiment of the present invention.

FIG. 7 is a block diagram showing an arrangement of a memory according to a fourth embodiment of the present invention. In this embodiment, the present invention is applied to a pseudo-static RAM. In FIG. 7, reference numeral 61 denotes a column circuit which constitutes a memory cell array. Circuit 61 includes normal operation sense amplifiers NSA1, NSA2, . . . , refresh operation sense amplifiers RSA1, RSA2, . . . , pairs of first bit lines 1BL0 and $\overline{\text{1BL0}}$, 1BL1 and $\overline{\text{1BL1}}$, . . . , a pair of second bit lines 2BL and $\overline{\text{2BL}}$, and the like. As shown in FIG. 8, a plurality of memory cells MC and one dummy cell DC are connected to each pair of lines 1BL and $\overline{\text{1BL}}$. Amplifier NSA1 is connected to one end of each of lines 1BL0 and $\overline{\text{1BL0}}$ through a pair of switches 62 which are conducted during a normal operation, and is connected to one end of each of lines 1BL1 and $\overline{\text{1BL1}}$ through a pair of switches 63 which are conducted during the normal operation. Amplifier RSA1 is connected to the other end of each of lines $\overline{\text{1BL1}}$ and $\overline{\text{1BL1}}$ through a pair of switches 64 which conduct during a refresh operation, and is connected to one end of each of lines 1BL2 and $\overline{\text{1BL2}}$ through a pair of switches 65 which conduct during the refresh operation. Similarly, each of other normal operation amplifiers NSA is provided between 2 sets of a pair of first bit lines through a pair of switches, and each of other refresh operation amplifiers RSA is provided between 2 sets of a pair of first bit lines through a pair of switches.

Lines 2BL and $\overline{\text{2BL}}$ are a pair of second bit lines provided along both sides of lines 1BL and $\overline{\text{1BL}}$ to transfer data. A pair of switching MOS transistors 66 are connected between lines 2BL and $\overline{\text{2BL}}$ and output terminals of sense amplifier NSA positioned therebetween. In addition, n column circuits 61 having the same arrangement described above are provided, and a decode output from block decoder 67 is supplied to the gates of transistors 66.

Cells MC and DC in FIG. 8 are selected in accordance with an output from decoder 68 to which address signals Ai to Ak are input.

Timing signal BS and address signals Aj+1 to Ak as a part of address signals Ai to Ak which are input to decoder 68 are input to decoder 67. In accordance with an output from decoder 67, transistors 66 conduct only in a number corresponding to the number of bits of data which are parallel-processed in the RAM, and cell data are transferred to 8 pairs of lines 2BL and 2BL selected from n pairs.

Lines 2BL and $\overline{\text{2BL}}$ are connected to data input/output circuit (data I/O) 71 through a pair of switching MOS transistors 70 which are controlled in accordance with a decode output from section decoder 69. The same address signals Aj+1 to Ak (where i<j<k, or i>j>k) as input to decoder 67 are input to decoder 71. In accordance with a decode output from decoder 69, only transistors 70 connected to 8 out of n pairs of lines 2BL and $\overline{\text{2BL}}$, to which data are already read out in accordance with control of decoder 67, are conducted. Therefore, 8-bit data is output from circuit 71.

In the fourth embodiment, since only necessary pairs of lines 2BL and $\overline{\text{2BL}}$ are activated, low current consumption and a high-speed operation can be simultaneously satisfied.

FIG. 9 is a circuit diagram showing an arrangement of a modification of the present invention. In the memory of the first embodiment, address signals Ai to Ak are supplied to each decoder without passing through a so-called core region where memory cell blocks 21, sense amplifiers 13, and the like are present. On the contrary, in a memory of this modification, signals $\overline{\text{PA1}}$, . . . , obtained by predecoding address signals Ai, $\overline{\text{Ai}}$ to Aj, and $\overline{\text{Aj}}$ by a plurality of NAND gates 81, and signals $\overline{\text{PB1}}$, . . . , obtained by predecoding address signals Aj+1, $\overline{\text{Aj+1}}$ to Ak, and $\overline{\text{Ak}}$ by a plurality of NAND gates 82, are supplied to core region 83. Full-decode signals E consisting of NOR logic signals of 2 kinds of predecode signals $\overline{\text{PA}}$ and $\overline{\text{PB}}$ are obtained by NOR gates 84 in region 83, and transistors 22 and 23 are conducted in accordance with signals E.

On the other hand, as control signals for conducting transistors 24 and 25, signals $\overline{\text{PB}}$ predecoded by gates 82 may be used.

According to the above arrangement, wiring lengths of address signals Aj+1 to Ak can be shortened to decrease parasitic capacitance. For this reason, the transfer delay time of signals Aj+1 to Ak can be decreased to realize a high-speed operation.

As has been described above, the memory of the present invention can realize low current consumption and a high-speed data transfer at the same time.

What is claimed is:

1. A random access memory comprising:
   a plurality of memory blocks, arranged two-dimensionally, each of said memory blocks comprising a plurality of memory cells;
   a plurality of pairs of data lines for transferring write-data to and read-data from said memory blocks;
   first switching means, responsive to an address signal, for connecting selected ones of said memory blocks to selected ones of said pairs of data lines;
   data input/output means, having fewer input terminals than the number of said pairs of data lines, for receiving write-data for said memory cells and for outputting read-data from said memory cells; and
   second switching means, coupled to said first switching means by said pairs of data lines and to said input/output means, for connecting said selected ones of said pairs of data lines to said data input/output means.

2. A random access memory according to claim 1, further comprising a column decoder for generating a first output signal to control operation of said first switching means, and a section decoder for generating a second output signal to control operation of said second switching means.

3. A random access memory according to claim 2, wherein address signals Ai to Ak are supplied to said column decoder and address signals Aj+1 to Ak, which are a part of said address signals Ai to Ak, are supplied to said second decoder.

4. A random access memory according to claim 1, further comprising a block decoder for generating a first output signal to control operation of said first switching means, and a section decoder for generating a second output signal to control operation of said section switching means.

5. A random access memory according to claim 4, wherein address signals Ai to Ak are supplied to said block decoder and said section decoder.

6. A random access memory comprising:
a plurality of memory blocks, arranged two-dimensionally, each comprising a plurality of memory cells;
a plurality of pairs of data lines for transferring input data to said memory cells;
a plurality of pairs of second data lines coupled between said memory blocks;
first switching means, responsive to an address signal, for connecting selected ones of said memory blocks to selected ones of said pairs of first data lines and for connecting said selected ones of said pairs of first data lines to selected ones of said pairs of second data lines;
data input/output means for receiving write-data for said memory cells and for outputting read-data from said memory cells, said data input/output means having fewer input terminals than the number of pairs of said data lines; and
second switching means, coupled to said first switching means by said pairs of second data lines and to said data input/output means, for connecting said selected pairs of second data lines to said data input/output means.

7. A random access memory according to claim 6, further comprising a switching decoder for generating a first output signal to control operation of said first switching means, and a section decoder for generating a second output signal to control operation of said second switching means.

8. A random access memory according to claim 7, wherein address signals Ai to Ak are supplied to said switching decoder, and address signals Aj+1 to Ak, which are part of address signals Ai to Ak, are supplied to said section decoder.

9. A random access memory according to claim 6 wherein said selected ones of said pairs of first data lines are coupled to selected ones of said memory cells in said selected ones of said memory blocks.

10. A random access memory comprising:
a plurality of groups of n memory blocks, each of said blocks having a plurality of memory cells and where n is a positive integer;
memory block selecting means for selecting one block from each group of blocks in accordance with a plurality of address signals;
a plurality of data latch means for latching write-data for and read-data from each selected block;
a plurality of pairs of data lines coupled to said latch means for transferring read-data from and write-data to each selected block;
first switching means for connecting selected ones of said data latch means to selected ones of said pairs of data lines in response to a control signal;
data input/output means, having fewer input terminals than the number of said pairs of data lines, for receiving write-data for and read-data from said memory blocks; and
second switching means, coupled to said first switching means by said pairs of data lines and to said data input/output means, for connecting said selected data lines to said data input/output means.

11. A random access memory according to claim 10, wherein said memory block selecting means includes a column decoder, and wherein said random access memory further comprises a section decoder for generating an output signal to control operation of said second switching means.

12. A random access memory according to claim 11, wherein address signals Ai to Ak are supplied to said column decoder and address signals Aj+1 to Ak, which are part of address signals Ai to Ak, are supplied to said section decoder.

* * * * *